United States Patent
Ong et al.

(10) Patent No.: US 6,310,565 B1
(45) Date of Patent: Oct. 30, 2001

(54) SAMPLING SWITCH HAVING AN INDEPENDENT "ON" IMPEDANCE

(75) Inventors: Adrian K. Ong, Madison; Vladimir I. Prodanov, New Providence; Maurice J. Tarsia, Colonia, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/497,612

(22) Filed: Feb. 3, 2000

(51) Int. Cl.[7] ................................................. H03M 1/00
(52) U.S. Cl. ............................................... 341/122; 327/91
(58) Field of Search ..................................... 341/122, 155, 341/172; 327/91, 90, 337

(56) References Cited

U.S. PATENT DOCUMENTS

| | | | |
|---|---|---|---|
| 5,084,634 | 1/1992 | Gorecki | 307/352 |
| 5,170,075 | 12/1992 | de Wit | 307/353 |
| 5,172,019 | 12/1992 | Naylor | 307/578 |
| 5,500,612 | 3/1996 | Sauer | 327/91 |
| 5,909,131 | 6/1999 | Singer | 327/91 |
| 5,936,562 | 8/1999 | Brooks | 341/143 |
| 5,945,872 | 8/1999 | Robertson | 327/541 |
| 6,249,154 | * 6/2001 | Jouffre et al. | 327/91 |

OTHER PUBLICATIONS

T. Brooks, D. Robertson, D. Kelly, A. Del Muro, S. Harston, A. Cascaded Sigma–Delta Pipeline A/D Converter with 1.25 MHz Signal Bandwidth and 89 dB SNR, Dec. 1997, 32(12) pp. 1896–1906.

A. Abo, P. Gray, A 1.5–V, 10–bit, 14.3MS/s CMOS Pipeline Analog–to–Digital Converter, May 1999, 34(5), pp. 599–606.

Y. Nakagome, H. Tanaka, K. Takeuchi, E. Kume, Y. Watanabe, T. Kaga, Y. Kawamoto, F. Murai, R. Izawa, D. Hisamoto, T. Kisu, T. Nishida, E. Takeda, K. Itoh, An Experimental 1.5–v 64–Mb DRAM, Apr. 1991, 26(4), pp.465–472.

I–C. Chen, S. Holland, C. Hu, Elecrtical Breakdown in Thin Gate and Tunneling Oxides, Feb. 1985, ED32(2), pp. 413–422.

A.K. Ong et al, "A Method For Reducing The Variation In "On" Resistance Of A MOS Sampling Swich", IEEE International Symposium On Circuits And Systems, May 28–31, 2000, pp. 437–440.

* cited by examiner

*Primary Examiner*—Peguy Jeanpierre
(74) *Attorney, Agent, or Firm*—Ozer M. N. Teitelbaum

(57) ABSTRACT

A sampling device for sampling an input signal in response to a pulse train of a sample signal. The sampling device includes a sampling transistor for creating samples in response to the sample signal. The sampling transistor has an impedance corresponding with the difference between the gate to source voltage and the threshold voltage of the sampling transistor. The sampling device also includes a control device for generating a control signal. The control device includes a bootstrap reference voltage source for providing a reference voltage in response to the sample signal, and a control circuit for generating the control circuit voltage in response to the sample signal. By this design, the control signal comprises the sum of the input signal and the sampling threshold voltage, the control signal comprises the sum of control circuit voltage and the reference voltage, and the gate to source voltage comprises the difference between the control signal and the input signal.

17 Claims, 4 Drawing Sheets

SAMPLING SWITCH HAVING AN INDEPENDENT "ON" IMPEDANCE

FIELD OF THE INVENTION

The present invention relates to a sample and hold circuit, generally, and more particularly, to a sampling switch having an "on" impedance independent of the input signal to be sampled.

BACKGROUND OF THE INVENTION

A commercial drive exists for reducing power consumption in electronic devices. In support of this effort, industry has attempted to exploit digital signal processing techniques to minimize the usage of high power consuming analog componentry. Digital processing necessitates the conversion of continuous analog signals into a digital data format using an analog-to-digital converter ("ADC").

ADCs convert analog signals into discrete digital data by performing a series of functional steps. These process steps include sampling, holding, quantizing and encoding. Though unique, these four steps need not be performed as independent operations. It is known, for example, to perform the sample and hold functions simultaneously using a single circuit.

Referring to FIGS. 1(a) and 1(b), a known circuit 10 for sampling and holding an analog signal, $V_{IN}$, is shown. Sample and hold circuit 10 comprises a metal oxide semiconductor ("MOS") type transistor $M_a$ having a source for receiving the continuous analog signal, $V_{IN}$. Further, the gate of transistor $M_a$ receives a sample signal, $\Phi_a$, which comprises a series of pulses. Each pulse of sample signal, $\Phi_a$, has a width, $\tau$, and a sampling periodicity $T_s$. As illustrated in FIG. 1(b), at the intervals when a sampling pulse of sample signal, $\Phi_a$, is received by the gate of transistor $M_a$, a segmented portion corresponding with the pulse width, $\tau$, of the pulse and the relative height of the continuous analog signal, $V_{IN}$, is captured as a sample. Thereafter, the sample is transferred to a capacitor, $C_a$, for interim storage. The held samples are represented by $V_{OUT}$.

One problem with ADCs, particularly when realized in MOS technology, is the linearity of the impedance of the sampling switches. As in the circuit of FIG. 1(a) hereinabove, the MOS transistor $M_a$ is turned on and off by the sample signal, $\Phi_a$, to produce the samples found in $V_{OUT}$. However, a relationship exists between the inherent impedance of the switch of circuit 10 and the input signal, $V_{IN}$. Upon receiving a sampling pulse of sample signal, $\Phi_a$, the impedance of the switch of circuit 10 is a function of the difference between the gate to source voltage ("$V_{GS}$") of transistor $M_a$ and the threshold voltage ("$V_{TH}$") of transistor $M_a$ for the duration of pulse width, $\tau$. The impedance of the switch of circuit 10, while a sampling pulse is received by transistor $M_a$, is also referred to as $R_{ON}$, and may be mathematically represented by the following formula:

$$R_{ON} = \frac{1}{\mu_n C_{OX} \frac{W}{L}(V_{GS} - V_{TH})}$$

where $\mu_n$ is the electron mobility, $C_{ox}$ is the capacitance of the gate oxide, W is the width and L is the length of the channel of transistor $M_a$, assuming the drain to source voltage ("$V_{DS}$") of transistor $M_a$ to be inconsequential and the applicability of square law behavior. As may be viewed by the above mathematical expression in view of circuit 10 of FIG. 1(a), $V_{GS}$ is equal to the difference between the "on" peak voltage of the pulse of sample signal $\Phi_1$, or $V_{DD}$, and the input signal $V_{IN}$.

Moreover, $V_{TH}$ also functionally corresponds with $V_{IN}$ by means of source bulk voltage ("$V_{SB}$"). $V_{TH}$ may be mathematically represented by the following formula:

$$_{TH} = V_{THo} + \gamma^*[\sqrt{2|\Phi_f| + V_{SB}} - \sqrt{2|\Phi_f|}]$$

where $V_{THo}$ is an initial threshold voltage constant, $\gamma$ is a body effect parameter and $\Phi_f$ is a quasi-Fermi potential of transistor $M_a$.

Given the hereinabove mathematical expressions, the "on" resistance, $R_{ON}$, is therefore a non-linear function of input signal $V_{IN}$. Signal distortion is a natural byproduct of the mathematical relationship of $R_{ON}$ with input signal $V_{IN}$, generally, and more particularly if the voltage levels of $V_{IN}$ change rapidly. Thus, efforts to lower signal distortion have focused on reducing the value of $R_{ON}$, as well as its dependence on the input signal $V_{IN}$.

Several solutions have been proposed to reduce the dependence of $R_{ON}$ on input signal $V_{IN}$. Each of these approaches, however, have particular shortcomings. These limitations include raising additional non-linearities, as well as failing to eliminate the dependent relationship between $V_{TH}$ on input signal $V_{IN}$ and thus $R_{ON}$ with input signal $V_{IN}$, irrespective of whether the frequency of the sample signal is or is not much greater than $V_{IN}$.

As such, there is a need to provide a sampling device having a switch with a gate source voltage, and, thus, an "on" impedance, $R_{ON}$, that is independent of the input signal being sampled. Likewise, there also exists a demand for a sampling device having a switch with a threshold voltage, and, hence, an "on" impedance, $R_{ON}$, independent of the input signal being sampled. Moreover, there is a need for a sampling device with a switch having an "on" impedance, $R_{ON}$, independent of the input signal being sampled which does not raise additional non-linearities, irrespective of whether the frequency of the sample signal is or is not much greater than that of the input signal.

SUMMARY OF THE INVENTION

A sampling device provides for sampling an input signal in response to a sample signal is disclosed. The sampling device comprises a sampling transistor for creating samples of the input signal in response to the sample signal. The sampling transistor has a gate to source voltage, a threshold voltage, and an "on" impedance corresponding with the difference between the gate to source voltage and the threshold voltage. Moreover, the sampling device comprises a control device for controlling the sampling transistor by generating a control signal in response to the sample signal. The control device comprises a bootstrap reference voltage source for providing a reference voltage in response to the sample signal, as well as a control circuit for generating a control circuit voltage in response to the sample signal. The control circuit voltage comprises the sum of the input signal and the threshold voltage, while the control signal comprises the sum of control circuit voltage and the reference voltage. By this arrangement, the gate to source voltage of the sampling transistor comprises the difference between the control signal and the input signal.

In a further embodiment of the present invention, the control circuit provides an operational amplifier for generating a node output in response to receiving the input signal and a feedback loop as inputs. The control circuit also comprises a control MOS transistor. The control MOS transistor has a gate coupled with the node output, a drain coupled with a supply voltage, such as the reference voltage for example, and a source coupled with the feedback loop.

In yet another embodiment of the present invention, the control circuit provides a fixed current source. The fixed current source is coupled with the source of the control MOS transistor and the feedback loop. By this arrangement, the feedback loop comprises the input signal.

In still another embodiment of the present invention, a sampling device is provided for sampling an input signal. The sampling device comprises a sampling switch for creating samples of the input signal. The sampling switch has a turn "on" voltage and an impedance. Further, the sampling device comprises a control device for generating a control signal to control the sampling switch. The control device comprises a reference voltage source for generating a reference voltage, and a control switch for generating a control switch voltage. The control switch voltage comprises the sum of the input signal and the turn on voltage. Moreover, the control signal comprises the sum of the control switch voltage and the reference voltage.

In yet still another embodiment of the present invention, the control switch comprises an operational amplifier for generating the control switch voltage. The operational amplifier receives the input signal and a feedback loop as inputs. The control switch also comprises a second transistor having an input terminal for receiving the control switch voltage, a first output terminal coupled to a supply voltage, such as the reference voltage for example, and a second output terminal coupled with the feedback loop.

In another embodiment of the present invention, the second output terminal of the second transistor in the control switch is coupled with a current source such that the feedback loop comprises the input signal.

In another embodiment of the present invention, a method is provided of making an "on" impedance of a sampling switch independent of an input signal. The sampling switch receives a gate to source voltage, a threshold voltage, and has an on impedance corresponding with the difference between the gate to source voltage and the threshold voltage. The method comprises the steps of providing a reference voltage in response to the sample signal, and generating a control signal in response to the sample signal to control the sampling switch. The step of generating a control signal comprises the steps of summing the input signal and the threshold voltage to generate a control circuit voltage in response to the sample signal, summing the control circuit voltage and the reference voltage to generate the control signal, and differentiating the control signal from the input signal to generate the gate to source voltage.

In another embodiment of the present invention, the step of summing the input signal and the threshold voltage to generate a control circuit voltage comprises the steps of receiving the input signal and a feedback loop as inputs to an operational amplifier, receiving an operational amplifier output at a gate of a control transistor, coupling a drain of the control transistor with a supply voltage, such as the reference voltage for example, and coupling a source of the control transistor with the feedback loop of the operational amplifier.

In another embodiment of the present invention, the step of coupling a source of the control transistor comprises the step of coupling a current source with the source of the control transistor such that the feedback loop comprises the input signal.

In another embodiment of the present invention, an analog to digital converter is provided which employs a sampling device for sampling the analog input signal and creating output samples. The sampling device comprises a sampling transistor for creating samples of the input signal in response to the sample signal. The sampling transistor comprises a gate to source voltage, a threshold voltage, and an on impedance corresponding with the difference between the gate to source voltage and the threshold voltage. The sampling device comprises a control device for controlling the sampling transistor by generating a control signal in response to the sample signal. The control device comprises a bootstrap reference voltage source for providing a reference voltage in response to the sample signal, and a control circuit for generating a control circuit voltage in response to the sample signal. By design, the control circuit voltage comprises the sum of the input signal and the threshold voltage, the control signal comprises the sum of control circuit voltage and the reference voltage, and the gate to source voltage comprises the difference between the control signal and the input signal. Moreover, the analog to digital converter further includes a holding device for holding the output samples, a quantizing device for quantizing the output samples, and an encoding device for encoding the quantized output samples.

One advantage of the present invention is to provide a sampling device having a switch having a gate source voltage, and, thus, an "on" impedance, $R_{ON}$, that is independent of the input signal.

Another advantage of the present invention is to provide a sampling device with a switch having threshold voltage, and, thus, an "on" impedance independent of the input signal.

Moreover, a further advantage of the present invention is to provide a sampling device having a switch with an "on" impedance independent of the input signal which does not raise additional non-linearities, irrespective of whether the frequency of the sample signal is or is not much greater than the input signal.

Other embodiment and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE PRESENT INVENTION

Figure 1A:
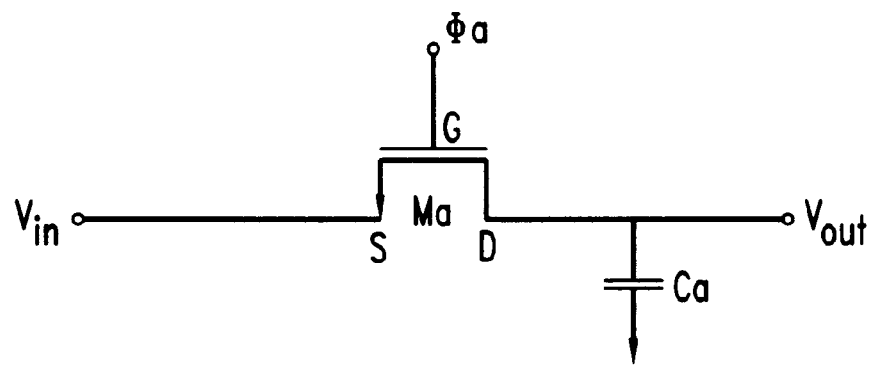
FIGS. 1(a) and 1(b) illustrate a known sampling switch and a timing diagram.
Figure 1B:
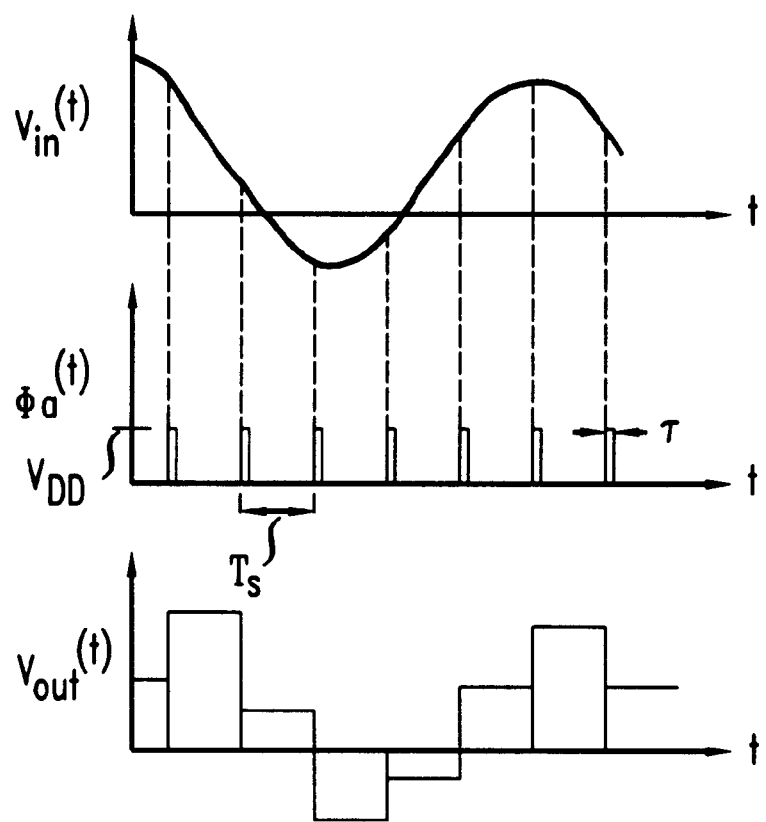
Figure 2:
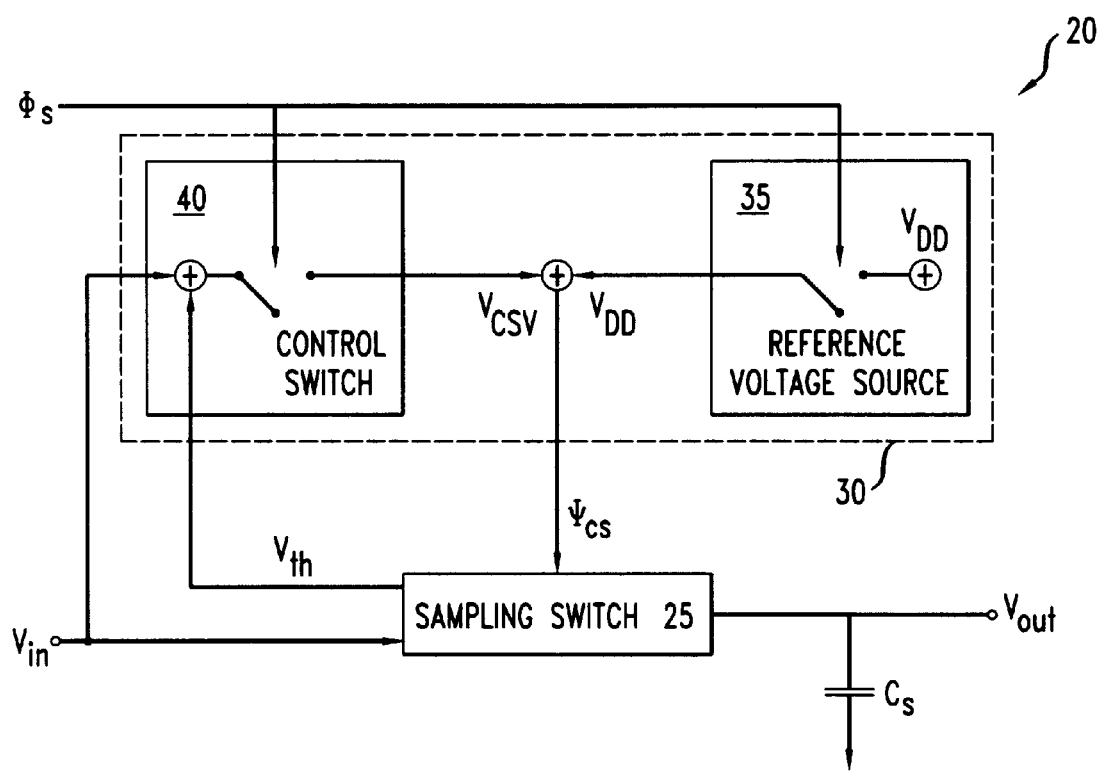
FIG. 2 illustrates a block diagram of an embodiment of the present invention.

Referring to FIG. 2, a block diagram of a sampling device 20 having an "on" impedance independent of an input signal is illustrated according to a first embodiment of the present invention. Sampling device 20 comprises a sampling switch 25 for creating samples, $V_{OUT}$, of an input signal, $V_{IN}$, and a device for holding each sample, such as a capacitor, $C_S$. The samples created of input signal, $V_{IN}$, are generated in response to a control signal, $\Psi_{cs}$. Control signal, $\Psi_{cs}$, is generated by a control device 30 for controlling sampling switch 25, and is derived from a sample signal, $\Phi_S$.

Sample signal, $\Phi_S$, comprises at least two pulse trains—$\Phi_{Son}$ and $\Phi_{Soff}$. When pulse train $\Phi_{Son}$ is received, control signal, $\Psi_{cs}$, enables the sampling switch 25 to capture samples of input signal, $V_{IN}$. In contrast, when pulse train $\Phi_{Soff}$ is received by control device 30, control signal, $\Psi_{cs}$, disables sample switch 25 from capturing samples. While mimicking the timing sequence of sample signal, $\Phi_S$, as will be evident from the disclosure hereinbelow, control signal, $\Psi_{cs}$, is distinguishable from the sample signal, $\Phi_S$, by the voltage levels created by the pulses in the pulse trains $\Phi_{Son}$.

To realize the functional purpose of control signal, $\Psi_{cs}$, control device 30 comprises a reference voltage source 35 and a control switch 40. Reference voltage source 35, in response to receiving pulses from the $\Phi_{Son}$ pulse train, generates a reference voltage $V_{DD}$. In one embodiment of the present invention, reference voltage source 35 is realized by a bootstrap charging device for charging to the reference voltage of sampling device 20 depending on the pulse train of sample signal $\Phi_S$. During the reception of pulse train $\Phi_{Soff}$, the bootstrap device is charged up to the reference voltage by a switch, for example, to generate the reference voltage when pulse train $\Phi_{Son}$ is received by control device 30. Given this functional purpose, in another embodiment, the bootstrap charging device comprises at least one capacitor.

Moreover, control device 30 comprises a control switch 40 for generating a control switch voltage, $V_{CSV}$, in response to pulse train $\Phi_{Son}$. Control switch voltage, $V_{CSV}$, comprises the sum of the input signal received by sampling switch 25 and a turn "on" or threshold switch voltage, $V_{TH}$, of switch 25. Threshold switch voltage, $V_{TH}$, is an intrinsic voltage level which sets the boundary as to whether switch 25 is on or off such that only when control signal, $\Psi_{cs}$, is above threshold switch voltage, $V_{TH}$, sampling switch 25 captures a sample of input signal, $V_{IN}$.

In one embodiment of the present invention, control switch 40 comprises a summing device for summing the input signal, $V_{IN}$, and threshold switch voltage, $V_{TH}$. The summing device is further coupled with a mechanism that enables switch 40 to generate the control switch voltage, $V_{CSV}$, in response to the pulse train $\Phi_{Son}$.

Control device 30 further comprises a second summing device for summing the outputs of the reference voltage source 35 and the control switch 40. This summation of outputs yields control signal, $\Psi_{cs}$. Thus, when the pulse train $\Phi_{Son}$ of sample signal, $\Phi_S$, is received by reference voltage source 35 and the control switch 40, control signal, $\Psi_{cs}$, comprises the sum of control switch voltage, $V_{CSV}$, and the reference voltage, $V_{DD}$.

By the above arrangement of elements, sampling switch 25 receives control signal, $\Psi_{cs}$, having a modified voltage level from sample signal, $\Phi_S$, with a substantially similar timing scheme. In one embodiment of the present invention, sampling switch 25 is realized by a MOS or equivalent type transistor. Here, the input or gate of such a transistor receives control signal, $\Psi_{cs}$. A first output terminal, or source, receives input signal, $V_{IN}$. A second output terminal, or drain, moreover, generates samples, $V_{OUT}$. The transistor impedance between the input and first output terminal of the transistor is a function of the difference in voltage between control signal, $\Psi_{cs}$, and input signal, $V_{IN}$, and is determined by performing a circuit analysis. This impedance during the pulse train $\Phi_{Son}$ of sample signal, $\Phi_S$, given the voltage level of control signal, $\Psi_{cs}$, is thereby independent of the input signal, $V_{IN}$.

The hereinabove realization is made more clear by recognizing that the impedance of the transistor is mathematically dependent on the difference between the input and first output terminal of the transistor, or, for example, the difference between the gate to source voltage, $V_{GS}$, and $V_{TH}$. From this relationship, it should be apparent that $V_{GS}$ comprises the difference between control signal, $\Psi_{cs}$, and input signal, $V_{IN}$, which may be rephrased as the difference between the sum of $V_{CSV}$ and $V_{DD}$, and the input signal, $V_{IN}$. As $V_{CSV}$ is equal to the sum of $V_{IN}$ and $V_{TH}$, $V_{GS}$ may ultimately be expressed as the sum of $V_{DD}$ and $V_{TH}$. Thus, the effective difference between $V_{GS}$ and $V_{TH}$ effectively may be expressed as reference voltage, $V_{DD}$.

Figure 3A:
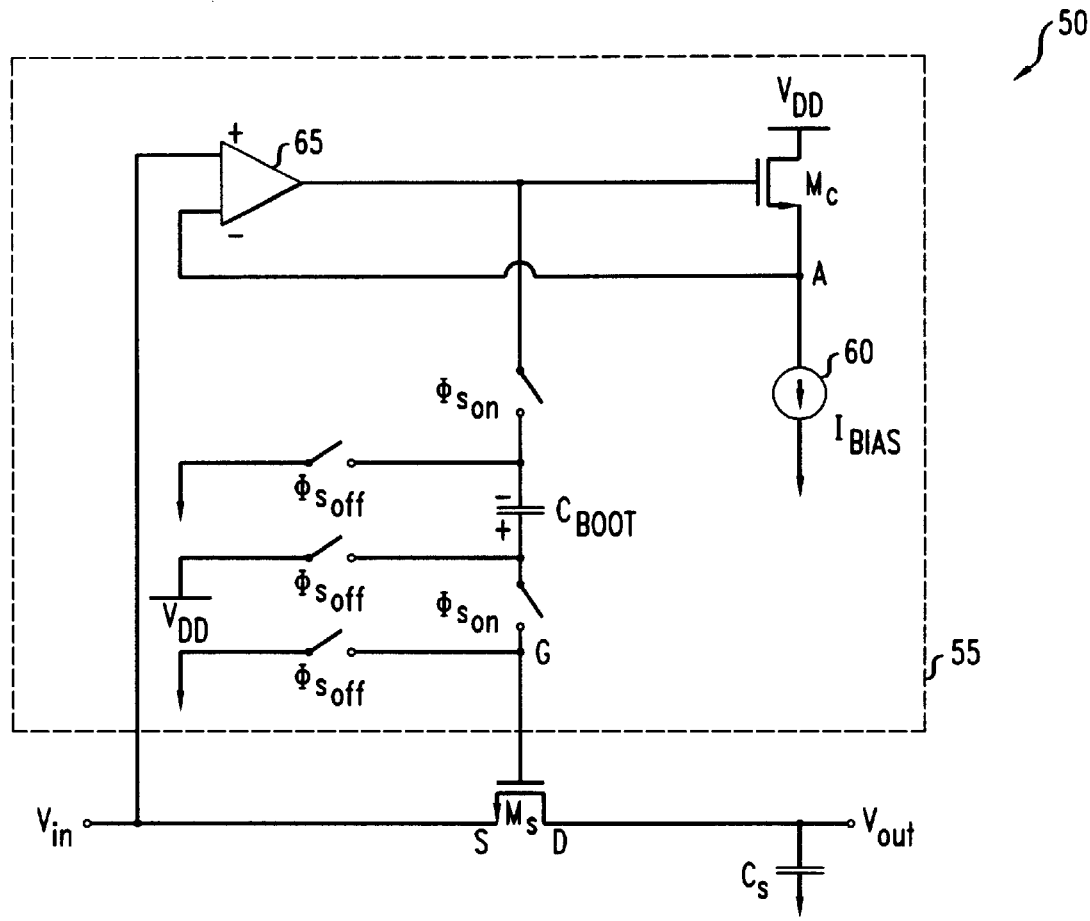
FIGS. 3(a) and 3(b) illustrate a circuit diagram and a timing diagram of another embodiment of the present invention.
Figure 3B:
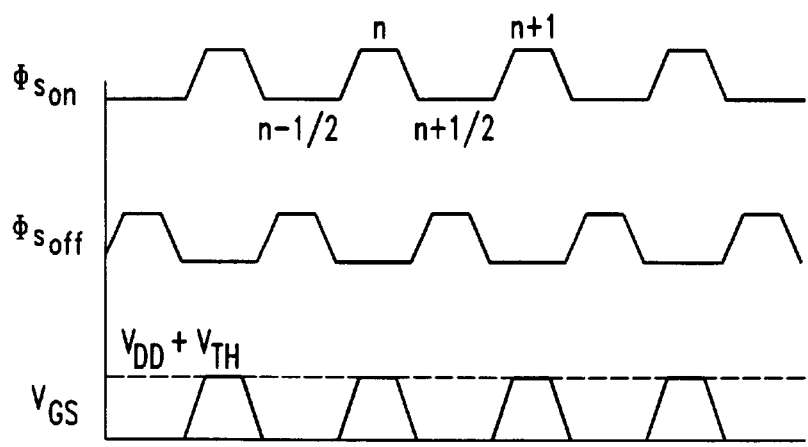

Referring to FIGS. 3(a) and 3(b), a sampling circuit 50 having an "on" impedance independent of an input signal and a corresponding timing diagram are illustrated according to a further embodiment of the present invention. Sampling circuit 50 comprises a sampling transistor, $M_S$, for capturing and creating samples of the input signal, $V_{IN}$, and a device for holding each sample, such as a capacitor, $C_S$. The samples created of input signal, $V_{IN}$, are generated in response to a sample signal, $\Phi_S$.

Referring to FIG. 3(b), sample signal, $\Phi_S$, comprises at least two pulse trains, $\Phi_{Son}$ and $\Phi_{Soff}$. In response to pulse train $\Phi_{Son}$, sampling transistor, $M_S$, is enabled to capture samples of input signal, $V_{IN}$. In contrast, sampling transistor, $M_S$, is disabled from capturing samples in response to pulse train $\Phi_{Soff}$.

In one embodiment of the present invention, sampling transistor, $M_S$, is a MOS type device. In such an arrangement, sampling transistor, $M_S$, comprises a voltage from its gate to its source, $V_{GS}$, as well as a threshold voltage, $V_{TH}$. Threshold voltage, $V_{TH}$, is a voltage level of the sampling transistor from which a higher voltage value turns transistor $M_S$ "on," and a lower voltage value turns transistor $M_S$ off. Transistor, $M_S$, moreover, has an "on" impedance which mathematically corresponds with the voltage difference between $V_{GS}$ and $V_{TH}$ in response to pulse train $\Phi_{Son}$. However, the values of both $V_{GS}$ and $V_{TH}$ depend on input signal, $V_{IN}$.

In view of the relationship between input signal, $V_{IN}$, and both $V_{GS}$ and $V_{TH}$, a control device 55 is coupled with sampling transistor, $M_S$. Control device 55 controls $V_{GS}$ of sampling transistor, $M_S$, by generating a control signal. The control signal for controlling sampling transistor, $M_S$, comprises a control circuit voltage.

Control device 55 comprises a bootstrap reference voltage source. In one embodiment of the present invention, the bootstrap reference voltage source comprises a capacitor, $C_{BOOT}$, and a series of switches causing the capacitor, $C_{BOOT}$, to provide a reference voltage when sample signal, $\Phi_S$, comprises pulse train $\Phi_{Son}$.

Further, control device 55 comprises a control circuit for generating the control circuit voltage in response to pulse train $\Phi_{Son}$. The control circuit comprises a control transistor, $M_C$. In one embodiment, control transistor, $M_C$ is a MOS type device having a drain, source and gate. The source of control transistor, $M_C$, is coupled with a fixed current source 60 at a node A. It should be noted that while the drain of transistor, $M_C$, is advantageously coupled with reference voltage, $V_{DD}$, alternatively, a supply voltage for maintaining the operative state of the transistor, $M_C$, may also be employed.

Fixed current source 60 functionally maintains the operational state of transistor, $M_C$, by providing a fixed current through node A and the source of transistor, $M_C$. Moreover, the gate of transistor, $M_C$, is coupled with the output of an operational amplifier 65 at node B. Operational amplifier 65 receives as inputs both the input signal, $V_{IN}$, and the voltage at node A in response to pulse train $\Phi_{Son}$. A feedback loop is created between operational amplifier 65 and transistor, $M_C$, by means of nodes A and B, such that the output of operational amplifier 65 at node B drives transistor, $M_C$, and the voltage at node A is $V_{IN}$. By this configuration, the control circuit voltage comprises the voltage at node B, in response to pulse train $\Phi_{Son}$. The voltage at node B comprises the sum of input signal, $V_{IN}$, and the threshold voltage of the transistor, $M_C$, in response to pulse train $\Phi_{Son}$.

In view of the operation of control circuit in response to pulse train $\Phi_{Son}$, the control signal generated by the control device 55 comprises the sum of the control circuit voltage created at node B and the reference voltage created by the bootstrap reference voltage source. The sum of these voltages is fed into the gate of sampling transistor, $M_S$. In so doing, the gate to source voltage, $V_{GS}$, of sampling transistor, $M_S$, is equal to the difference between the control signal and the input signal, $V_{IN}$. These terms may be simplified by restating the control signal as being the sum of $V_{IN}$, $V_{TH}$ and $V_{DD}$, such that the gate to source voltage, $V_{GS}$, may be expressed as the sum of $V_{DD}$ and $V_{TH}$. The value of the gate to source voltage, $V_{GS}$, as a function of the sample signal, $\Phi_S$, is illustrated in FIG. 3(b).

As stated hereinabove, the mathematical expression for the "on" impedance is a function of the difference between the gate to source voltage, $V_{GS}$, and the threshold voltage, $V_{TH}$, of the sampling transistor. Therefore, this difference between $V_{GS}$ and $V_{TH}$, employing the derived values from the hereinabove circuit, results in $V_{TH}+V_{DD}-V_{TH}$, or simply $V_{DD}$. Given that $V_{DD}$ is a stable power supply voltage, the "on" impedance of sampling transistor, $M_S$, is independent of the input signal, $V_{IN}$.

It should be noted that it is advantageous in the above sampling device to select identical threshold voltages, $V_{TH}$, for both sampling and control transistors, $M_S$ and $M_C$. In so doing, the derivation of the "on" impedance, generally, and more particularly, the difference between $V_{GS}$ and $V_{TH}$ of the sampling transistor enables the threshold terms to more efficiently drop out upon performing a circuit analysis. However, variations in the threshold voltages, $V_{TH}$, for both sampling and control transistors, $M_S$ and $M_C$, may be compensated for by various means apparent to one of ordinary skill upon reviewing the instant disclosure.

As detailed hereinabove, the control circuit and bootstrap voltage reference source comprise a series of switches to control sampling transistor, $M_S$. These switches are best understood in view of FIG. 3(b). When pulse train $\Phi_{Soff}$ is generated, a series of switches couple sampling transistor, $M_S$, to a ground. Moreover, pulse train $\Phi_{Soff}$ decouples sampling transistor, $M_S$, from control device 55, and because the threshold voltage is not exceeded, transistor, $M_S$, is turned off such that samples are not captured of the input signal, $V_{IN}$. During this same period, bootstrap capacitor, $C_{BOOT}$, is coupled between ground and reference voltage source, and decoupled from the remainder of the control circuit. Bootstrap capacitor, $C_{BOOT}$, as a result, charges up to the reference voltage during pulse train, $\Phi_{Soff}$.

In contrast, a switch couples sampling transistor, $M_S$, to control device 55 in response pulse train $\Phi_{Son}$. Pulse train $\Phi_{Son}$ couples bootstrap capacitor, $C_{BOOT}$, to node B. Moreover, bootstrap capacitor, $C_{BOOT}$, is decoupled from the reference voltage source and ground in response pulse train $\Phi_{Son}$.

Figure 4:
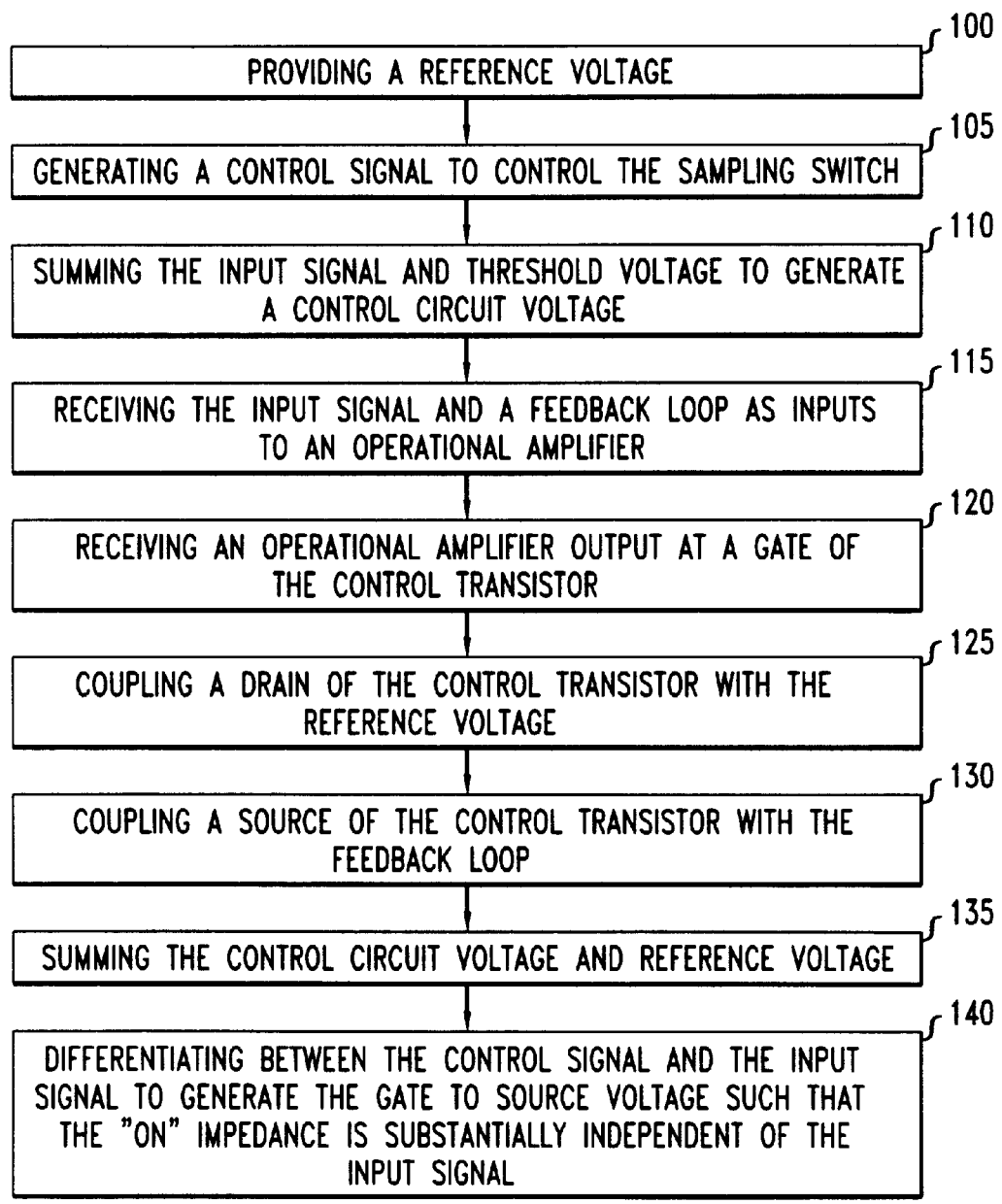
FIG. 4 illustrates a flow chart of another embodiment of the present invention.

Referring to FIG. 4, a flow chart of a method of making an on impedance of a sampling switch independent of an input signal according to another embodiment of the present invention is illustrated. The sampling switch comprises a gate to source voltage, $V_{GS}$, a threshold voltage, $V_{TH}$, and an "on" impedance corresponding with the difference between $V_{GS}$ and $V_{TH}$. The method comprises a series of steps such as the step (100) of providing a reference voltage, $V_{DD}$, in response to the sample signal. The reference voltage in one embodiment is created in response to the sample signal by a bootstrap capacitor.

Following the flow chart, the method comprises the step (105) of generating a control signal in response to the sample signal to control the sampling switch. Thereafter, the step (110) of summing the input signal, $V_{IN}$, and the $V_{TH}$ to generate a control circuit voltage is executed in response to the sample signal. This summing step in turn may comprise the steps (115,120,125, and 130) of receiving the input signal and a feedback loop as inputs to an operational amplifier, receiving an operational amplifier output at a gate of a control transistor, coupling a drain of the control transistor with $V_{DD}$, and coupling a source of the control transistor with the feedback loop. An additional summing step (135) is subsequently executed to sum the control circuit voltage and $V_{DD}$. It should be noted that the step (125) of coupling a drain of the control transistor with reference voltage, $V_{DD}$, might alternatively be realized by coupling a supply voltage for maintaining the operative state of the transistor to its drain.

A differentiating step (140) is then executed for assessing the difference between the control signal and $V_{IN}$. In so doing, $V_{GS}$ of the sampling transistor comprises the sum of $V_{DD}$ and $V_{TH}$. In so doing, the "on" impedance is independent of the input signal.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. Thus, for example, while the present invention details a sampling device having an independent "on" impedance primarily for use in an analog to digital converter, it should be apparent to one of ordinary skill of its broader applications such as within a switched-capacitor filter, for example. Moreover, it should be apparent to one of ordinary skill that the present invention may be employed to create a full differential sampling configuration, wherein at least two transistors sample the voltage difference between the input signals of both respectively. It is therefore contemplated that the appended claims will cover any such modifications or embodiments as fall within the true scope of the invention.

What is claimed is:

1. A sampling device for sampling an input signal in response to a sample signal, the sampling device comprising:

a sampling transistor for creating samples of the input signal in response to the sample signal, the sampling transistor having a gate to source voltage, a threshold voltage, and, an on impedance corresponding with the difference between the gate to source voltage and the threshold voltage; and a control device for controlling the sampling transistor by generating a control signal in response to the sample signal, the control device comprising:

a bootstrap reference voltage source for providing a reference voltage in response to the sample signal; and a control circuit for generating a control circuit voltage in response to the sample signal, the control circuit voltage comprising the sum of the input signal and the threshold voltage, the control signal comprising the sum of control circuit voltage and the reference voltage, and the gate to source voltage comprising the difference between the control signal and the input signal.

2. The sampling device of claim 1, wherein the sampling transistor is a MOS device and comprises a gate for receiving the control signal, a source for receiving the input signal, and a drain for creating the samples.

3. The sampling device of claim 2, wherein the control circuit comprises:

an operational amplifier for generating a node output in response to receiving the input signal and a feedback loop as inputs; and a control MOS transistor having a gate coupled with the node output, a drain coupled with the reference voltage, and a source coupled with the feedback loop.

4. The sampling device of claim 3, wherein the control circuit comprises a fixed current source coupled with the source of the control MOS transistor and the feedback loop such that the feedback loop comprises the input signal.

5. The sampling device of claim 4, wherein the bootstrap reference voltage source comprises a bootstrap capacitor for charging to the reference voltage in response to the sample signal.

6. A sampling device for sampling an input signal, the sampling device comprising:

a sampling switch for creating samples of the input signal, the sampling switch having a turn on voltage and an impedance; and a control device for generating a control signal for controlling the sampling switch, the control device comprising:

a reference voltage source for generating a reference voltage; and a control switch for generating a control switch voltage, the control switch voltage comprising the sum of the input signal and the turn on voltage, and the control signal comprising the sum of the control switch voltage and the reference voltage.

7. The sampling device of claim 6, wherein the sampling switch comprises a first transistor having an input terminal for receiving the control signal, a first output terminal for receiving the input signal, and a second output terminal for creating the samples.

8. The sampling device of claim 7, wherein the control switch comprises:

an operational amplifier for generating the control switch voltage, the operational amplifier receiving the input signal and a feedback loop as inputs; and a second transistor having an input terminal for receiving the control switch voltage, a first output terminal coupled the reference voltage, and a second output terminal coupled with the feedback loop.

9. The sampling device of claim 8, wherein the second output terminal of the second transistor is coupled with a current source such that the feedback loop comprises the input signal.

10. The sampling device of claim 6, wherein the reference voltage source comprises a bootstrap charging device for charging to the reference voltage.

11. A method of making an on impedance of a sampling switch independent of an input signal, the sampling switch comprising a gate to source voltage, a threshold voltage, and an on impedance corresponding with the difference between the gate to source voltage and the threshold voltage, the method comprising:

providing a reference voltage in response to the sample signal;

generating a control signal in response to the sample signal to control the sampling switch, wherein the step of generating a control signal comprises:

summing the input signal and the threshold voltage to generate a control circuit voltage in response to the sample signal;

summing the control circuit voltage and the reference voltage to generate the control signal; and differentiating the control signal from the input signal to generate the gate to source voltage.

12. The method of claim 11, further comprising the step of creating samples of the input signal in response to the sample signal.

13. The method of claim 12, wherein the step of creating samples of the input signal comprises:

receiving the sample signal at an input of the sampling switch;

receiving the input signal at a first output terminal of the sampling switch; and creating samples at a second output terminal of the sampling switch.

14. The method of claim 11, wherein the step of summing input signal and the threshold voltage to generate a control circuit voltage comprises:

receiving the input signal and a feedback loop as inputs to an operational amplifier;

receiving an operational amplifier output at a gate of a control transistor;

coupling a drain of the control transistor with the reference voltage; and coupling a source of the control transistor with the feedback loop of the operational amplifier.

15. The sampling device of claim 14, wherein the step of coupling a source of the control transistor comprises the step of coupling a current source with the source of the control transistor such that the feedback loop comprises the input signal.

16. The method of claim 11, further comprising the step of charging to the reference voltage in response to the sample signal.

17. An analog to digital converter for converting an analog input signal into a digital output signal, the analog to digital converter comprising:

a sampling device for sampling the analog input signal and creating output samples, the sampling device comprising:

a sampling transistor for creating samples of the input signal in response to the sample signal, the sampling transistor having a gate to source voltage, a threshold voltage, and, an on impedance corresponding with the difference between the gate to source voltage and the threshold voltage; and a control device for controlling the sampling transistor by generating a control signal in response to the sample signal, the control device comprising:
  a bootstrap reference voltage source for providing a reference voltage in response to the sample signal; and
  a control circuit for generating a control circuit voltage in response to the sample signal, the control circuit voltage comprising the sum of the input signal and the threshold voltage, the control signal comprising the sum of control circuit voltage and the reference voltage, and the gate to source voltage comprising the difference between the control signal and the input signal; and a holding device for holding the output samples;

a quantizing device for quantizing the output samples; and an encoding device for encoding the quantized output samples.

* * * * *